(12) United States Patent
Boysel

(10) Patent No.: US 8,593,036 B2
(45) Date of Patent: Nov. 26, 2013

(54) HIGH-EFFICIENCY MEMS MICRO-VIBRATIONAL ENERGY HARVESTER AND PROCESS FOR MANUFACTURING SAME

(75) Inventor: Robert Mark Boysel, Honeoye Falls, NY (US)

(73) Assignee: MCB Clean Room Solutions, LLC, Honeoye Falls, NY (US)

( * ) Notice: Subject to any disclaimer, the term of this patent is extended or adjusted under 35 U.S.C. 154(b) by 191 days.

(21) Appl. No.: 13/030,182

(22) Filed: Feb. 18, 2011

(65) Prior Publication Data
US 2011/0210554 A1     Sep. 1, 2011

Related U.S. Application Data

(60) Provisional application No. 61/308,354, filed on Feb. 26, 2010.

(51) Int. Cl.
*H01L 41/08*     (2006.01)
(52) U.S. Cl.
USPC .......................................... 310/339; 310/370
(58) Field of Classification Search
USPC ......... 310/339, 338, 319, 322, 330–332, 329, 310/324; 29/25.35
IPC ...................................................... H01L 41/08
See application file for complete search history.

(56) References Cited

U.S. PATENT DOCUMENTS

| | | |
|---|---|---|
| 3,371,234 A | 2/1968 | Cady |
| 3,456,134 A | 7/1969 | Ko |
| 4,363,993 A | 12/1982 | Nishigaki et al. |
| 5,233,256 A | 8/1993 | Hayashi et al. |
| 5,515,725 A | 5/1996 | Tabota et al. |
| 6,246,155 B1 | 6/2001 | Nishihara et al. |
| 6,407,484 B1 | 6/2002 | Oliver et al. |
| 6,550,116 B2 | 4/2003 | Nishihara et al. |
| 6,830,944 B1 | 12/2004 | Smits |

(Continued)

FOREIGN PATENT DOCUMENTS

| | | |
|---|---|---|
| EP | 1 723 461 B1 | 6/2009 |
| WO | WO 2008/116173 A1 | 9/2008 |

OTHER PUBLICATIONS

PCT International Search Report and Written Opinion for International Application No. PCT/US 11/25567; Date of Mailing May 10, 2011. 8 pages.

(Continued)

*Primary Examiner* — Thomas Dougherty
*Assistant Examiner* — Karen B Addison
(74) *Attorney, Agent, or Firm* — Patent Technologies, LLC; Robert D. Gunderman, Jr.

(57) ABSTRACT

The present invention relates generally to a High Efficiency MEMS Micro-Vibrational Energy Harvester (μVEH) having a thick beam bimorph architecture. The disclosed architecture is capable of producing a voltage of sufficient magnitude such that the requirement to connect a plurality of harvesters in series to produce an adequate voltage magnitude is eliminated.

25 Claims, 17 Drawing Sheets

(56) References Cited

U.S. PATENT DOCUMENTS

| | | |
|---|---|---|
| 6,858,970 B2 | 2/2005 | Malkin et al. |
| 6,895,645 B2 | 5/2005 | Xu et al. |
| 6,954,025 B2 | 10/2005 | Nishida et al. |
| 7,053,737 B2 | 5/2006 | Schwartz et al. |
| 7,084,554 B2 | 8/2006 | Xu et al. |
| 7,459,827 B2 | 12/2008 | Kawakubo et al. |
| 7,644,490 B1 * | 1/2010 | Niblock et al. .......... 29/622 |
| 7,681,290 B2 | 3/2010 | Clingman et al. |
| 2003/0113990 A1 * | 6/2003 | Grube et al. ............ 438/52 |
| 2005/0117835 A1 * | 6/2005 | Nguyen et al. ............ 385/14 |
| 2005/0280334 A1 * | 12/2005 | Ott et al. ................. 310/339 |
| 2007/0114890 A1 * | 5/2007 | Churchill et al. .......... 310/339 |
| 2007/0125176 A1 | 6/2007 | Liu |
| 2008/0074002 A1 | 3/2008 | Priya et al. |
| 2010/0072759 A1 | 3/2010 | Andosca et al. |

OTHER PUBLICATIONS

Renaud et al. "Fabrication, modelling and characterization of MEMS peizoelectric vibration harvesters". Published paper. Available online Nov. 19, 2007. 7 pages. Elsevier.

Web pages from Imec web site dated Nov. 5, 2010. 11 pages. Author Unknown. "Micropower Generation and Storage". http://www.imec.be/ScientificReport/SR2009/HTML/1213371.html.

Web pages from ElectroIQ web site dated Nov. 5, 2010. 5 pages. Author Unknown. http://www.electroiq.com/index/display/Nanotech_Article_Tools_Template/_printArticle/a . . . .

\* cited by examiner

HIGH-EFFICIENCY MEMS MICRO-VIBRATIONAL ENERGY HARVESTER AND PROCESS FOR MANUFACTURING SAME

This application claims priority to U.S. Patent Application Ser. No. 61/308,354 filed Feb. 26, 2010 entitled "High-Efficiency MEMS Micro-Vibrational Energy Harvester And Process For Manufacturing Same" by Robert Mark Boysel of Honeoye Falls, N.Y., U.S.A.

BACKGROUND OF THE INVENTION

1. Field of the Invention

The present invention relates generally to energy scavengers and energy harvesters which convert ambient forms of energy into electricity, and more particularly to vibrational energy harvesters that convert environmental mechanical vibrational energy to electrical energy utilizing piezoelectric type materials.

2. Description of the Related Art

One of the most familiar types of energy harvester is the solar cell. Additionally, there are energy harvesters that convert thermal gradients, wind power, water power, and the like into electric power. To take advantage of these types of energy harvesters, environmental contact such as exposure to light, thermal gradients wind, water, and the like is required. These types of energy harvesters are not commonly found in enclosed environmental spaces such as HVAC systems or walls, embedded in machinery or tissue, or other applications that do not have access to external environmental energy sources.

Alternatively, vibrational type energy harvesters (VEHs) are able to take advantage of environmental vibrations created by appliances, HVAC systems, equipment, motors, human movement, and the like, to produce electrical power or electricity in open as well as enclosed environmental spaces. These environmental vibrational frequencies are typically found in the 1-1000 Hz range. In general, a VEH comprises a proof mass on a spring. The spring is typically a cantilever beam. The mass/spring combination has a resonant frequency and, although it can respond to a spectrum of vibrational frequencies, it responds most strongly to ambient vibrations around that resonant frequency. This resonant motion can be converted to electricity using techniques such as electromagnetic pick-up or piezoelectric generation.

Energy harvesters are well known in the art for use in a variety of applications. However, due to the limitations described herein, they are not well known for wireless applications. They have been suggested for wireless sensor applications to provide the electrical energy to power a sensor and/or charge an associated battery. Wireless sensors measure environmental variables and transmit the measured data back to a receiver without any cabling or wires. Typically, the data is transmitted using radio frequency signals and the power for the sensor is provided by a battery, capacitor, or similar energy storage device. Wireless sensors have many potential applications because they can be used where it is difficult to get wires or as after-market system upgrades requiring no additional cabling. Some of the many applications that have been identified that could benefit from wireless sensors include:

- Monitoring of infrastructure integrity, such as buildings and bridges,
- Air quality monitoring in HVAC (heating, ventilation, and air conditioning) systems,
- Monitoring industrial processes, such as chemical or food production,
- Equipment health monitoring,
- Medical implants or mobile personal health monitoring,
- Automotive sensors, such as tire pressure monitors, and
- Defense and security applications such as chemical and biological monitoring of buildings and public spaces.

These applications have not developed as quickly as predicted, in part, because of the difficulty of providing power to the sensors. Although batteries can be used, they have a limited life and must be replaced periodically. Since remote sensors are typically placed in inaccessible places (because of the difficulty of running wiring), battery changing can be difficult or impossible. There is additionally a cost for using batteries which includes labor, the recurring cost of the battery, and disposal, with its attendant environmental concerns. One solution to this wireless sensor power problem is to provide power using energy scavengers or energy harvesters which can convert ambient forms of energy into electricity for use by the sensor or for charging the battery. Microfabricated MEMS VEH devices may provide such a solution.

Microfabricated VEH Devices (μVEHs), however, have their own set of problems. Typically, a piezoelectric MEMS μVEH consists of a cantilever beam element capped with a piezoelectric film and terminated with a proof mass. When the device vibrates, the mass stresses the cantilever beam, including the piezoelectric film. The stress in the piezoelectric film generates charge and a voltage difference is created across the capacitor formed by the piezoelectric between the top and bottom surfaces.

The resonant frequency (f) of a spring/mass combination is represented by the equation $f=(1/2\pi)(k/M)^{1/2}$, where k is the spring constant and M is the proof mass. Because of their small size (i.e. short springs and small masses), μVEHs typically have, high resonant frequencies (>500 Hz). In order to achieve the desired low resonant frequency configuration and sensitivity, the cantilever beam (spring) must be long (a few mm), thin, and compliant, and the mass must be large (a few milligrams). For MEMS μVEHs, this is difficult. MEMS fabrication is based on thin film processing techniques developed by the semiconductor industry. Conducting, insulating, semiconductor, and piezoelectric films are deposited using sputtering, vacuum evaporation, or chemical vapor deposition and are typically only 1-3 microns thick (or less). A 5 micron thick film is a very thick film deposition for a microfabrication process. It is relatively difficult to construct large structures with such thin film fabrication techniques.

Additionally piezoelectric μVEHs produce voltages of only a few hundredths of a volt and power levels of only a few μW or less. One of the primary reasons for such low outputs is the limited stress that can be applied to the piezoelectric element. It is known in the art that the stress in a bending cantilever beam element is proportional to the distance of the element from the neutral axis of the cantilever. The neutral axis is defined as the line where the stress is zero. When the cantilever bends downward, the stress above the neutral axis is tensile. Below the neutral axis, it is compressive. When it bends upward, the stresses reverse. If the neutral axis falls inside the piezoelectric material, the charge generated above the neutral axis is canceled by charge of the opposite polarity generated below. In the design of an energy harvester, then, it is desirable to keep the neutral axis outside the piezoelectric element.

The easiest way to get the entire piezoelectric film away from the neutral axis is to deposit it on a base. This is commonly achieved by placing the thin piezoelectric film on a thicker silicon (Si) or silicon dioxide mechanical cantilever.

This single element, or monomorph, architecture can be fabricated several ways. One way is to deposit the mechanical base layer on a standard Si wafer prior to deposition of the piezoelectric and electrode films. This base layer must be relatively thick (in microelectronics terms), for example, 3-5 microns thick. Even so, the neutral axis will be just inside or just below the piezoelectric. A second approach is to use a silicon-on-insulator (SOI) wafer that has a single crystal silicon layer a few microns thick atop a buried oxide layer which again is atop a thick handle.

In both cases, the bulk of the silicon wafer is etched off the back under the piezoelectric, leaving the piezoelectric film and the support layer (either oxide or silicon) freely suspended. Because the neutral axis is so close to the piezoelectric element, only low stresses are produced, so these MEMS μVEHs tend to generate only a few hundredths to tenths of a volt per "g" of acceleration, where "g" is the acceleration due to gravity.

A second limitation of the MEMS monomorph architecture is that the mechanical energy that drives the cantilever must be shared between bending the support cantilever and bending the piezoelectric element. The energy that is required to bend the support does not go into straining the piezoelectric, thereby limiting the amount of voltage that can be developed.

One approach that has been employed to compensate for the low stress and enhance the output voltage is to connect multiple cantilevers in series. The difficulty with this approach is that in order to respond identically to input acceleration, the cantilevers and proof masses must be identical. Otherwise, they will have different resonant frequencies or phases and interfere with one another. Microfabrication process variations have to be well controlled. Additionally, valuable chip space is lost since it must be used for redundant cantilevers to boost output at a single frequency. This chip space could more advantageously be used for cantilevers with different resonant frequencies to broaden the band of harvested frequencies.

Another approach that has been taken to enhance the generated voltage is to fabricate a piezoelectric bimorph on the support cantilever. This, however, has its own difficulties. Fabrication of a MEMS bimorph requires several additional thin film depositions to prevent shorting of the layers together when bondpad metallization is deposited. These additional thin film depositions include the extra piezoelectric element, electrode and additional insulation layers. Several additional photomasks are also required to permit etching of the first electrode and piezoelectric element in order to gain access to the center electrode and to open up electrical, contacts in the insulating layer. One thin film piezoelectric, PZT (Lead Zirconate Titanate), is commonly used because of its high piezoelectric constant. However, PZT is very difficult to etch. Aluminum nitride (AlN) has been commonly used instead because it is very compatible with semiconductor processes, and can be etched. However, finding etches that are selective between MN and its common electrode material molybdenum (Mo) is also challenging. Another challenge is that precision is required when building the bimorph to get the numerous film thicknesses correct in order to place the neutral axis correctly.

An issue all the aforementioned MEMS approaches have in common is film stress gradient control. Each of the depositions are typically performed at different temperatures, such that as the film stacks are built up, differential thermal expansion of the substrate and films build up stresses in the stack. These are typically very tensile stresses. When the final release of the cantilever takes place, the stresses can cause the cantilevers to curl up, sometimes well over 360°. This built in stress can be mitigated by adding a compressive overlayer of oxide. Unfortunately, however, the thickness of this compensating layer has to be fine tuned to balance out the stack stress. This can be accomplished, but balancing acts are hard to maintain, as processes and materials possess variability.

It is therefore an object of the present invention to provide an energy harvester with a cantilever structure not prone to physical defects. It is another object of the present invention to provide an energy harvester with improved power output. It is yet another object of the present invention to provide an energy harvester with improved efficiencies and greater frequency range. It is another object of the present invention to provide an energy harvester with improved energy transfer. These and other objects of the present invention are not to be considered comprehensive, or exhaustive, but rather; exemplary of objects that may be ascertained after reading this specification with the accompanying drawings and claims.

BRIEF SUMMARY OF THE INVENTION

In accordance with the present invention, there is provided a vibrational energy harvesting device comprising a cantilever having a first end, a second end and a core having a first planar surface and a second planar surface, the core being fabricated as two plate layers and bonded together; a first piezoelectric stack having a piezoelectric material placed between a first conductive layer and a second conductive layer and attached to the first planar surface of said core; a second piezoelectric stack having a piezoelectric material placed between a first conductive layer and a second conductive layer and attached to the second planar surface of to said core; and a casing wherein the first end of the cantilever is joined to the casing and the second end is free to move.

The foregoing paragraph has been provided by way of introduction, and is not intended to limit the scope of the following claims.

BRIEF DESCRIPTION OF THE DRAWINGS

The invention will be described by reference to the following drawings, in, which like numerals refer to like elements, and in which.

Figure 1A:
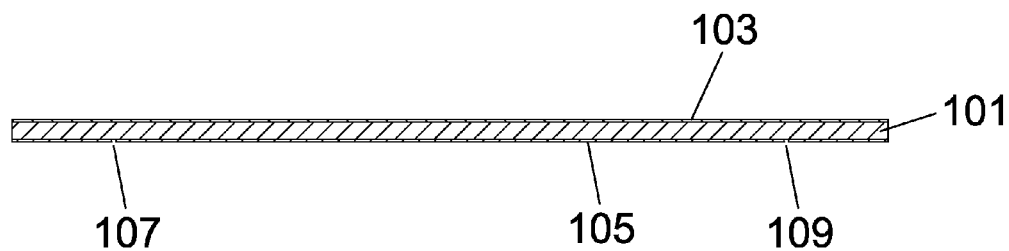
FIG. 1a is a cross sectional view of silicon having an oxide layer.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, drawings, and the appended claims.

DESCRIPTION OF THE PREFERRED EMBODIMENTS

For a general understanding of the present invention and the various embodiments described or envisioned herein, reference is made to the drawings. In the drawings, like reference numerals have been used throughout to designate identical elements.

Related Terminology

MEMS: Micro-Electro-Mechanical Systems. MEMS are integrated circuits (ICs) to manufactured using processes and equipment similar to that used in the microelectronics industry. MEMS ICs include mechanical, fluidic, or optical elements in addition to electrical circuits. MEMS ICs are used for applications such as miniature sensors and transducers.

Piezoelectric: A material property for which the application of a force or stress to a piezoelectric sensitive material results in the development of a charge in the material which in turn generates an electric field in the material. The piezoelectric property is a tensor property. The application of a stress along one dimension can result in an electric field being generated along another dimension.

Vibrational energy harvester: A device which uses ambient environmental vibrational energy (e.g. equipment or motor vibrations, footsteps) to generate electricity. This electricity can be used in a variety of applications such as to replace or recharge batteries for applications that do not have access to line power.

Bimorph: A bimorph is a piezoelectric device consisting of two piezoelectric elements attached to each other or to an intermediate support to form a bending element. The piezoelectric elements are positioned so that they are parallel to each other and located on either side of the neutral axis formed by the combination.

Elastic element: An elastic element is a mechanical element which obeys Hooke's Law: $F=k\Delta x$. That is, a displacement $\Delta x$ from equilibrium of the mechanical element produces a restoring force F that is proportional to the displacement. The constant of proportionality k is commonly referred to as, the spring constant. The most common elastic element is a mass on a spring. For the energy harvester of the present invention the elastic element is a bending element which is stationary at one end and for which the displacement is the deviation from equilibrium of the unsupported end.

Thin film: Thin films are the key components of all microelectronics and MEMS processes. A thin film is a thin layer of a material (e.g. metal, insulator, or semiconductor) which is deposited on a substrate (typically a; silicon wafer, although other wafer substrates such as glass, ceramic, and gallium arsenide can be used) using one of several methods common in the semiconductor/MEMS industry. These include PVD (physical vapor deposition—sputtering and vacuum evaporation), diffusion (thermal oxide, growth), CVD (chemical vapor deposition including both Low Pressure CVD (LPCVD) and Plasma Enhanced CVD (PECVD), Molecular Beam Epitaxy (MBE), and Atomic Layer Deposition (ALD). These films range from monolayers only a few Angstroms thick to typically less than 10 microns thick.

Electrically insulating film or layer: An electrical insulator is a material which does not conduct electricity. In microelectronics and MEMS these films are typically silicon dioxide (SiO2) or silicon nitride (Si3N4) or non-stoichiometric films containing silicon and oxygen or nitride, or metal oxides.

Etch mask: In order to build microelectronic or MEMS devices it is necessary to etch patterns into the thin films. This is typically accomplished by coating the layer with a photoimageable material (photoresist) into which the desired pattern is exposed with a photomask and developed, similar to photographic film. The pattern can then be etched into the thin film with a wet chemical or dry plasma etch, after which the photoresist is removed. Sometimes the pattern etched into the thin film can be used as a further mask for etching underlying films.

Etch stop: MEMS fabrication processes often rely on the selectivity to different materials of the etches used. The hard etch mask described above is an example of that. The hard mask is resistant to the chemistry used to etch the layers below it. This selectivity can also be used to determine how deep an etch can go. An etch stop, is a buried layer of material that is resistant to the etch chemistry. Thus when a material is being etched, the etch will continue until it reaches the resistant material below (the etch stop), and etch no further.

Sacrificial layer: Sacrificial layers are key elements: in fabricating MEMS. A sacrificial layer is a thin film that is deposited and upon which a subsequent layer or layers of thin films are deposited and patterned to form the MEMS mechanical structure. The final step of the MEMS process is to selectively etch out the sacrificial layer, leaving the MEMS structure free to move.

DETAILED DESCRIPTION

A novel High Efficiency MEMS Micro-Vibrational Energy Harvester (μVEH) having a thick beam bimorph architecture is described. The architecture of the present invention places energy harvesting elements "face-to-face" to form a bimorph with its neutral axis in a central thick core layer.

There are many advantages of this configuration. First, this approach enables a MEMS architecture with long cantilever springs and a large proof mass, thereby enabling response to low frequencies. Second, the piezoelectric elements can be placed arbitrarily far from the neutral axis, thus increasing the stress on (and voltage output from) the piezoelectric element. When stressed, each element in its entirety is in either compression or tension, thereby increasing efficiency. Third, a cantilever support layer is no longer necessary, and cane be partially or completely eliminated, allowing more of the input mechanical force to be applied to the piezoelectric elements. Fourth, the bimorph is created by bonding wafers face-to-face, eliminating the need for complex multi-film, multi-process bimorph structures. Fifth, since the piezoelectric elements are bonded face-to-face, any differential film-stresses built into the film stacks will be self-compensated, since the films will push against each other. A single bimorph using this architecture will produce sufficient voltage and power to eliminate the need for multiple connected harvesters working at the same resonant frequency.

The present invention is a MEMS piezoelectric vibrational energy harvester having a "thick beam bimorph" architecture. The vibrational energy harvester comprises a free-floating mass, referred to as a "proof mass", which is attached to one end of one or more elastic elements, each of which is attached at the opposing end to a stationary support. The elastic element includes two piezoelectric elements, each element of which contains at least one piezoelectric film with a first electrode and a second electrode, and both elements separated by a spacer or spacers forming a thick beam region through and parallel to which the neutral axis of the spring passes. A cantilever is an example of an elastic element.

This "thick beam" architecture ensures that each piezoelectric element is, in its entirety, in tension or compression, thus increasing the efficiency of the energy harvester. Each piezoelectric element can be displaced by the spacers arbitrarily far from the neutral axis, thus increasing the stress in the piezoelectric elements for a given cantilever beam deflection and thereby increasing the output power for a given elastic element deflection. The neutral axis defines the plane above which the stress, and hence the charge and electric field generated, has one polarity and below which it has the opposite polarity. If the neutral axis lies within a piezoelectric element, the electric field below the axis will cancel a portion of the field above the axis, leading to inefficient voltage generation. For large energy harvesters, this is avoided by using a bimorph architecture in which two piezoelectric elements are stacked, placing the neutral axis between them. For MEMS energy harvesters, which use thin piezoelectric films for the piezoelectric elements, this is avoided by building the piezoelectric film on top of a thicker elastic substrate. MEMS bimorphs can be fabricated on the elastic substrate, but film thickness control becomes critical if the neutral axis is to lie between these thin films.

The amount of stress developed in a piezoelectric material is proportional to its distance from the neutral axis. Because the films used to fabricate MEMS vibrational energy harvesters (VEHs) are so thin, it is difficult to get the piezoelectric element far from the neutral axis. The thick beam bimorph architecture uses spacers that can be made arbitrarily thick. Thus, the piezoelectric elements can be placed farther from the neutral axis than is possible for most MEMS designs, thereby increasing the output power and voltage for a given cantilever deflection.

One way some MEMS VEHs get the piezoelectric film far from the neutral axis is to deposit the film on a wafer and then etch away most of the wafer under the film leaving the piezoelectric film supported by a thick layer of silicon which acts as an elastic support element. This elastic element can then be tens of microns thick, successfully lifting the piezoelectric element away from the neutral axis. However, it is very difficult, if not impossible, to build a bimorph by fabricating a second piezoelectric element on the backside of this thick silicon support element.

The thick beam bimorph architecture of the present invention eliminates these issues by providing a thick spacer which can be plated or otherwise deposited to any desired thickness.

Figure 18:
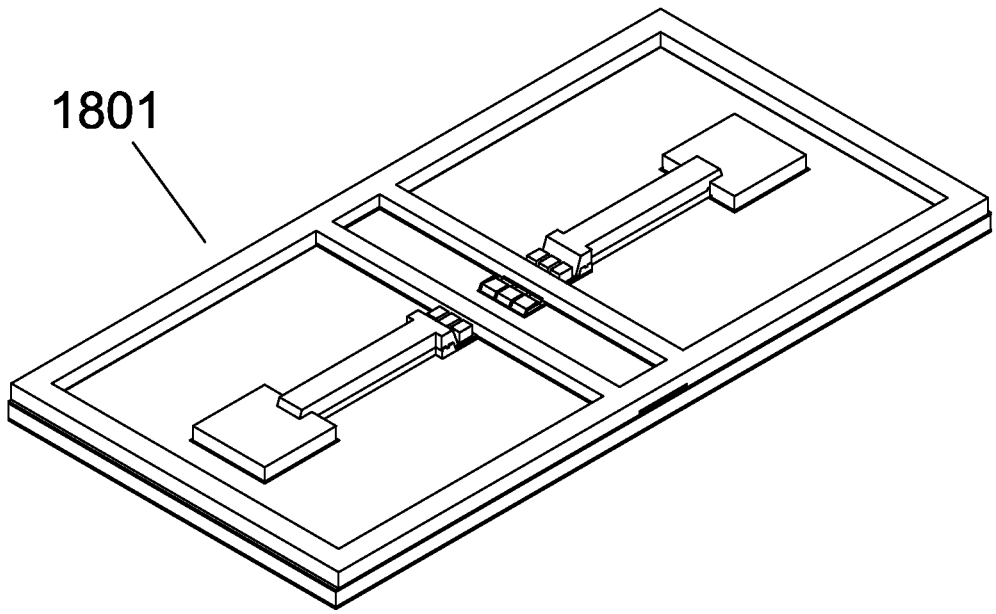
FIG. 18 is a perspective view of the device prior to bonding.
Figure 19:
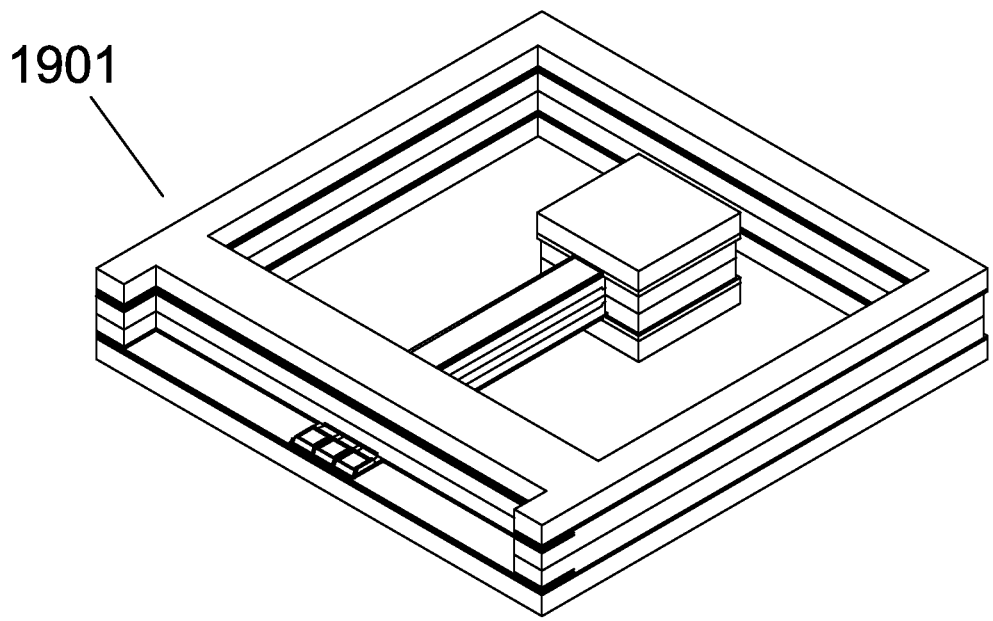
FIG. 19 is a perspective view of the bonded, device.
Figure 20:
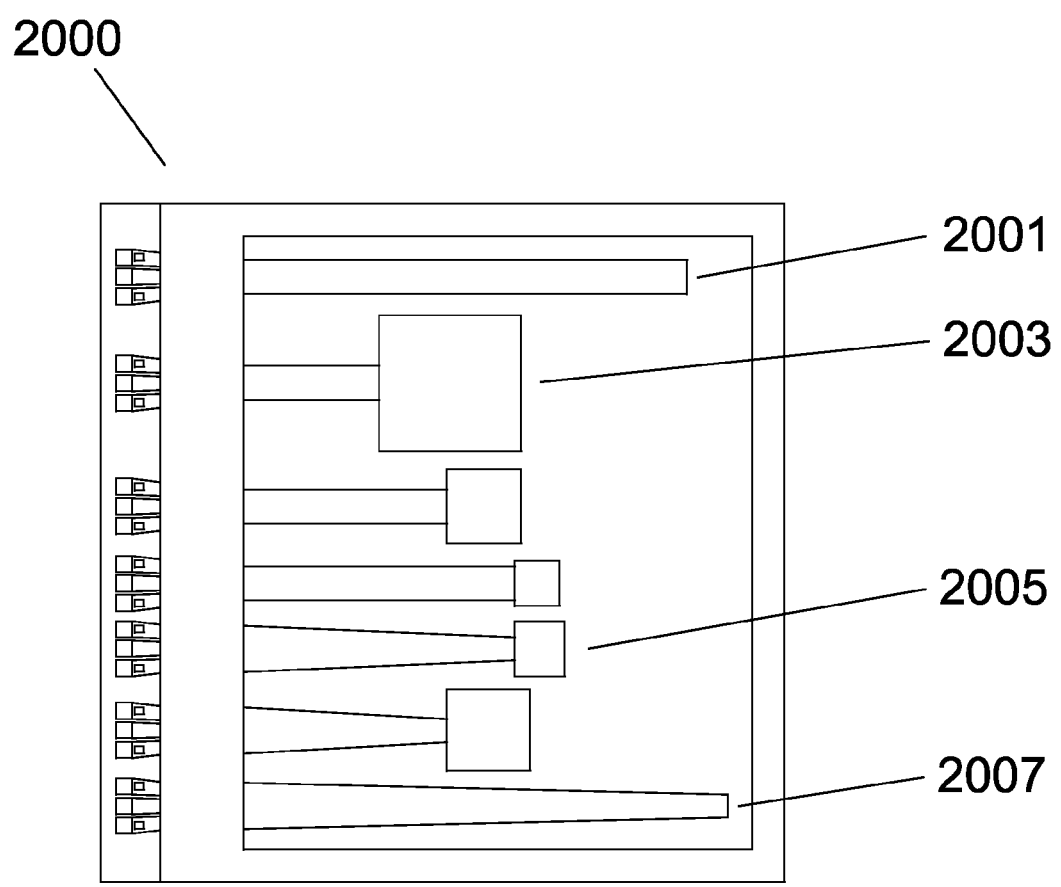
FIG. 20 depicts a chip with exemplary cantilevers of the present invention.

To fully describe how to make and use the present invention, and various embodiments and variants thereof, a series of drawings is presented. FIGS. 1-15 describe each of the processing steps involved in fabricating the present invention. In FIGS. 1-10, each figure is accompanied by an "a" view and a "b" view. The "a" view is a cross sectional view of the layers, material and structure of the present invention. The "b" view is a perspective view of the present invention at the point of processing depicted in the "a" view. FIGS. 11-15 depict the final processing steps of the novel energy harvester of the present invention. It should be observed through the drawings that many of the improvements to energy harvesting come about through the novel aspects of process and structure. For example, the energy harvester of the present invention is built using two "book halves" that are bonded together to form an improved cantilever structure. FIG. 18 clearly shows the two "book halves" prior to bonding, and FIG. 19 clearly shows the two "book halves" after bonding and before capping and final packaging and assembly. FIG. 16 provides an exploded view of the layers and materials of the energy harvester of the present invention. The processing steps taken to fabricate the novel energy harvester are provided in FIG. 17, the callout numbers corresponding to previous figure numbers to thoroughly and adequately describe how to make the present invention. Variations on each of these steps can be taken to better suit constraints such as environment, cost, production equipment, application, and the like. These variations will be known to those who are skilled in the art, of which these variations are to be fully within the scope of the claims as appended herein. Lastly, FIG. 20 provides several exemplary geometries of the energy harvester of the present invention contained on a chip. To use the energy harvester of the present invention, a suitable package such as, for example, a ceramic or plastic structure, contains the energy harvester of the present invention. Further, in some embodiments of the present, invention, the energy harvester may be contained within or upon a chipset. A chipset is a structure that may contain the energy harvester alone or with other devices such as microelectronic devices, other micro electro mechanical machines, energy storage devices, sensors, and the like. The energy harvester is connected either directly to a device requiring electrical power or an electrical energy storage device such as a battery or an ultracapacitor with the appropriate power rectification circuitry for converting oscillatory current electric power to direct current electric power. Such power rectification circuitry is known to those skilled in the art, and may include wave rectification using diodes or similar semiconductor devices. The power rectification circuitry may also include filters to remove unwanted frequencies or harmonics, transient suppressors, and the like. The energy harvester with accompanying electronics is then placed in or upon, or otherwise mechanically coupled to, an environmental element that is generating vibrational energy to be harvested. Such environmental elements could be, for example, a bridge, a roadway, machinery, transportation equipment, electrical equipment, oscillatory structures or devices, and the like. The energy harvester of the present invention may be adapted to various resonant frequencies to efficiently harvest the vibrational energy of its host by way of modifying the length of the cantilever, the geometry of the cantilever, the proof mass of the cantilever, the space surrounding the cantilever, the cavity or structure of the energy harvester, the addition of elements to the energy harvester such as frequency tuning or phase shift structures, and the like.

Figure 1B:
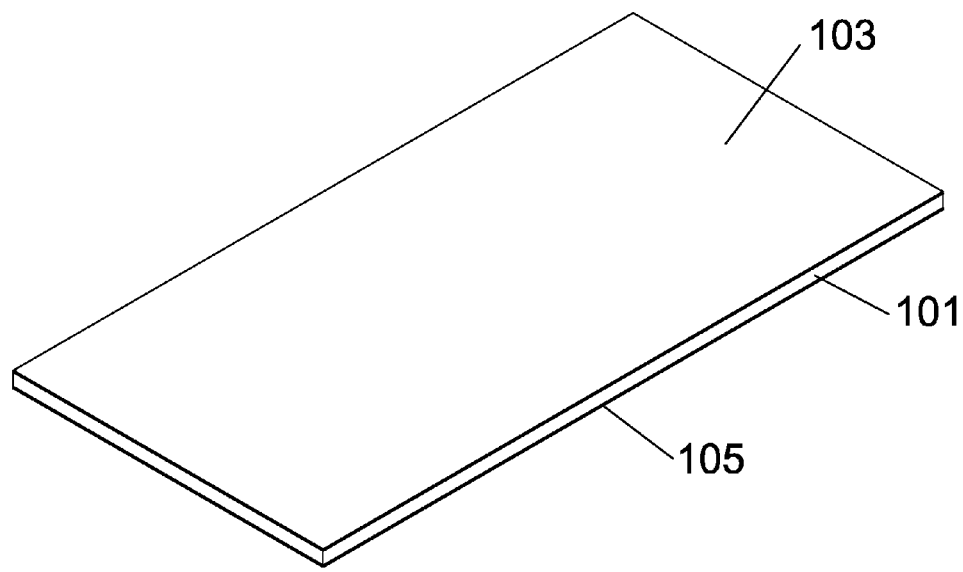
FIG. 1b is a perspective view of silicon having an oxide layer.

To begin construction of the energy harvester of the present invention, a wafer or similar substrate, such as a silicon wafer, is oxidized through a process such as thermal oxidation. By way of example and not limitation, FIG. 1a is a cross sectional view of silicon having an oxide layer. FIG. 1b is a perspective view of silicon having an oxide, layer. A substrate 101 such as a silicon substrate, for example, a double side polished (DSP) wafer, is oxidized on both sides through a process such as thermal oxidation to create a first oxide layer 103 and a second oxide layer 105. The thickness of the oxide layer may vary, but may be in the range of 0.1 to 10 microns. To facilitate fabrication, alignment features 107 and 109 are created through a process such as photolithography. The alignment features 107 and 109 are areas where the oxide layer is removed entirely or in part. The flowchart of FIG. 17 illustrates this as step 001, create oxide layer.

Figure 2A:
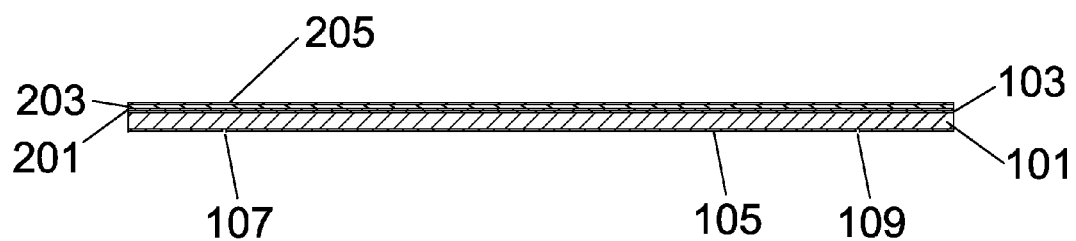
FIG. 2a is a cross sectional view of the addition of a piezoelectric stack.
Figure 2B:
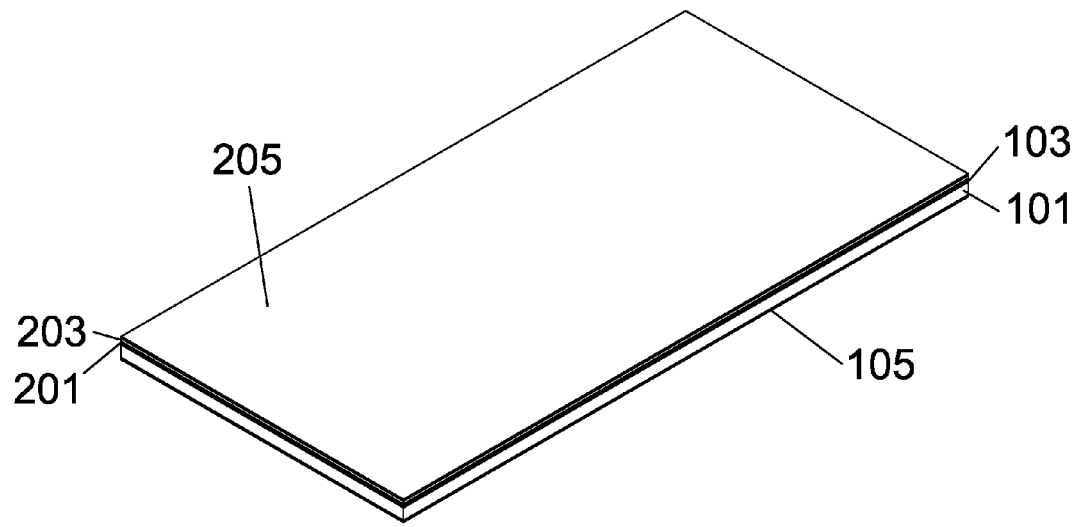
FIG. 2b is a perspective view of the addition of a piezoelectric stack.
Figure 17:
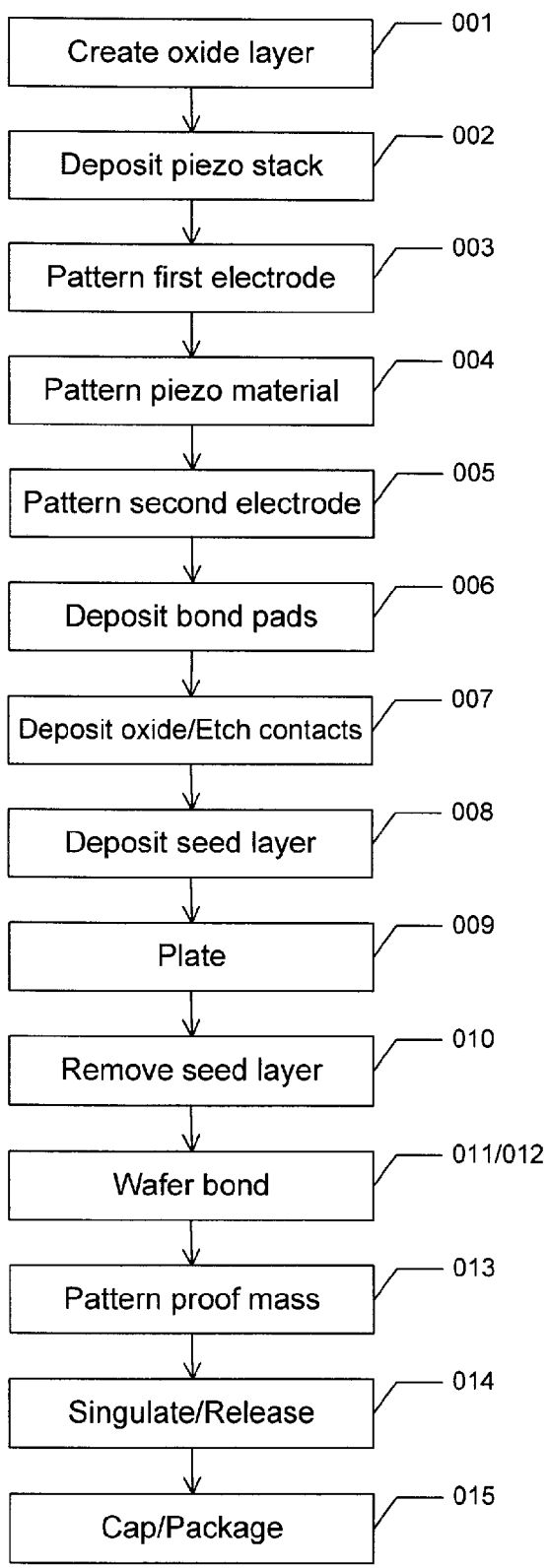
FIG. 17 is a flowchart showing processing steps.

The next processing step, described in FIG. 17 as step 002 deposit piezo stack, is depicted by way of FIGS. 2a and 2b where FIG. 2a is a cross sectional view of the addition of a piezoelectric stack and FIG. 2b is a perspective view of the addition of a piezoelectric stack. A first conductive layer 205, for example, Molybdenum in a thickness of from about 1000 angstroms to about 10,000 angstroms, is deposited. Other conductive materials include, for example, gold, copper, platinum and the like. Then a layer of piezoelectric material 203 is deposited on the first conductive layer 201, for example, Aluminum Nitride in a thickness of from about 100 angstroms to about 5000 angstroms. Other piezoelectric materials include, for example, barium titanate, lead titanate, gallium orthophosphate, bismuth ferrite, sodium potassium niobate, sodium niobate, polyvinylidene fluoride, and the like. On top of the piezoelectric 203 is deposited a second conductive layer 205, for example, Molybdenum in a thickness of from about 1000 angstroms to about 10,000 angstroms. Other conductive materials include, for example, gold, copper, platinum, and the like.

Figure 3A:
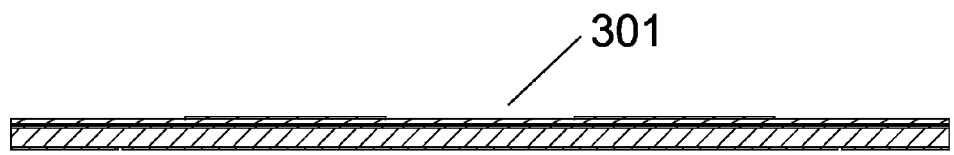
FIG. 3a is a cross sectional view of the addition of a first electrode pattern.
Figure 3B:
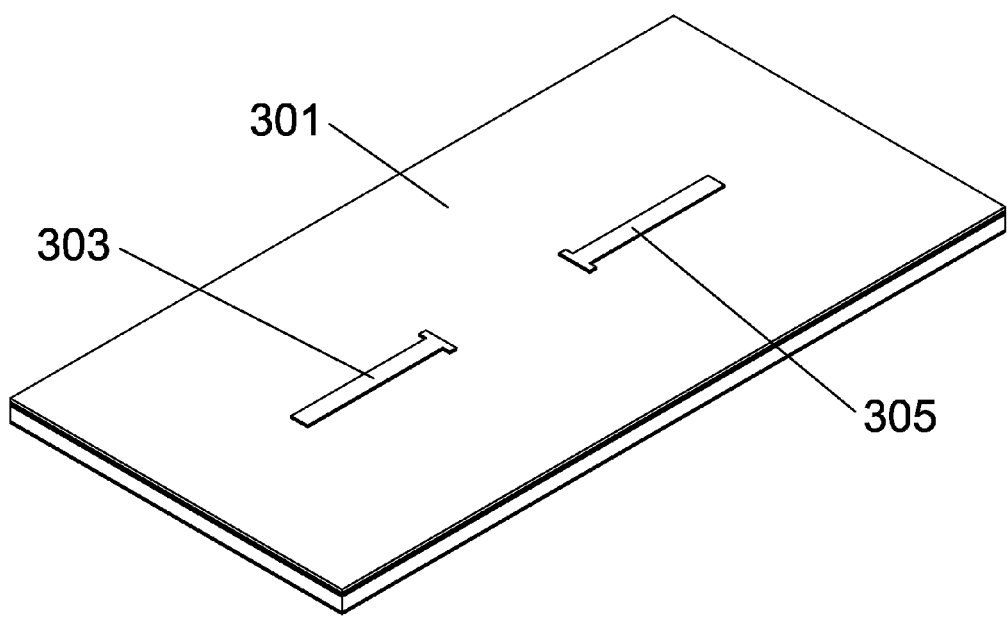
FIG. 3b is a perspective view of the addition of a first electrode pattern.

As depicted in FIG. 17, the first electrode is patterned in step 003. FIG. 3a is a cross sectional view of the addition of a first electrode pattern. FIG. 3b is a perspective view of the addition of a first electrode pattern. The selective removal 301 of the second conductive layer 205 (depicted in FIG. 2) forms the first electrode pattern. Visible in FIG. 3b is the first cantilever form half 303 and the second cantilever form half 305. The first electrode may be patterned by way of selective material removal, for example by way of selectively etching the second conductive layer 205 with a reactive ion etch such as $SF_6$ or $CF_4$ after masking.

Figure 4A:
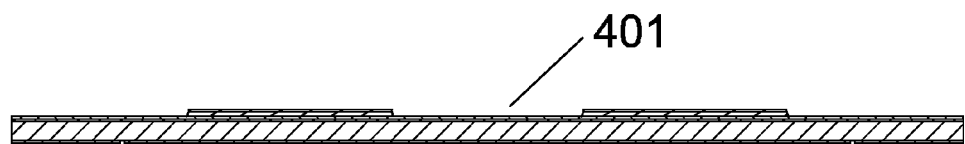
FIG. 4a is a cross sectional view of the addition of a piezoelectric pattern.
Figure 4B:
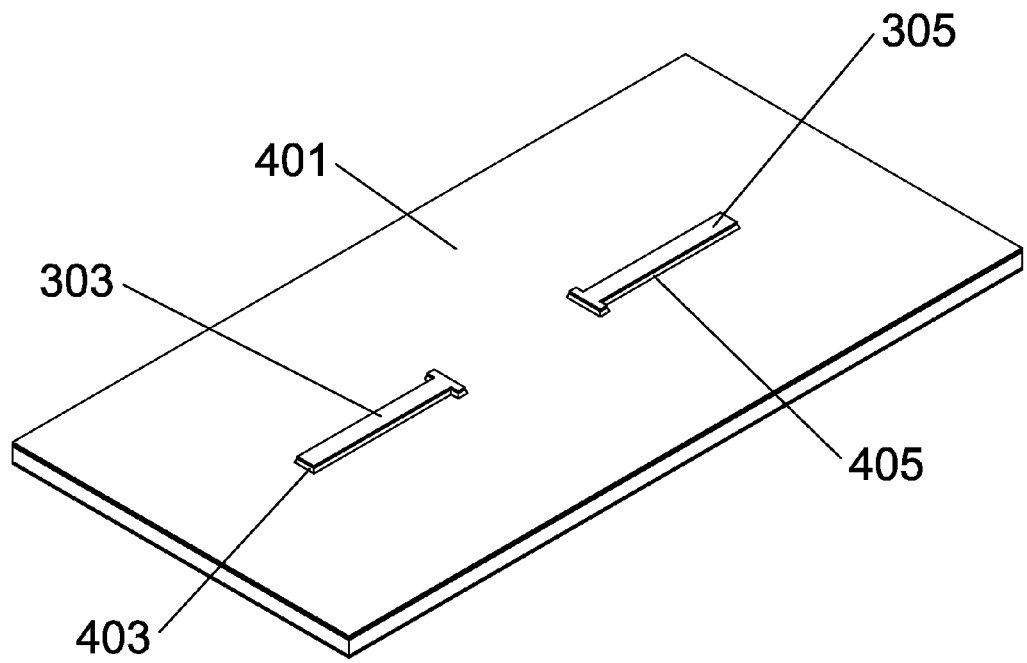
FIG. 4b is a perspective view of the addition of a piezoelectric pattern.

Step 004 in FIG. 17 involves the pattern of piezo material. FIG. 4a is a cross sectional view of the addition of a piezoelectric pattern. FIG. 4b is a perspective view of the addition of a piezoelectric pattern. A selective removal 401 of the piezoelectric material 203 (depicted in FIG. 2) such as an etch using KOH with aluminum nitride as the piezoelectric material results in a first cantilever form half 403 and a second cantilever form half 405, as shown in FIG. 4b. The conductive layer is used as an etch mask to provide a first cantilever form half and a second cantilever form half.

Figure 5A:
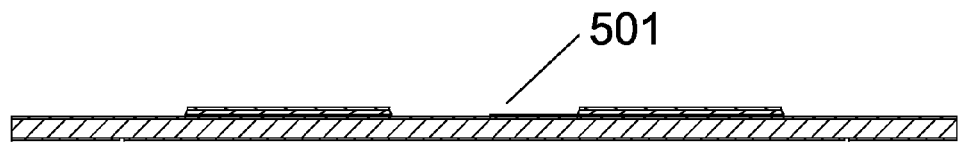
FIG. 5a is a cross sectional view of the addition of a second electrode pattern.
Figure 5B:
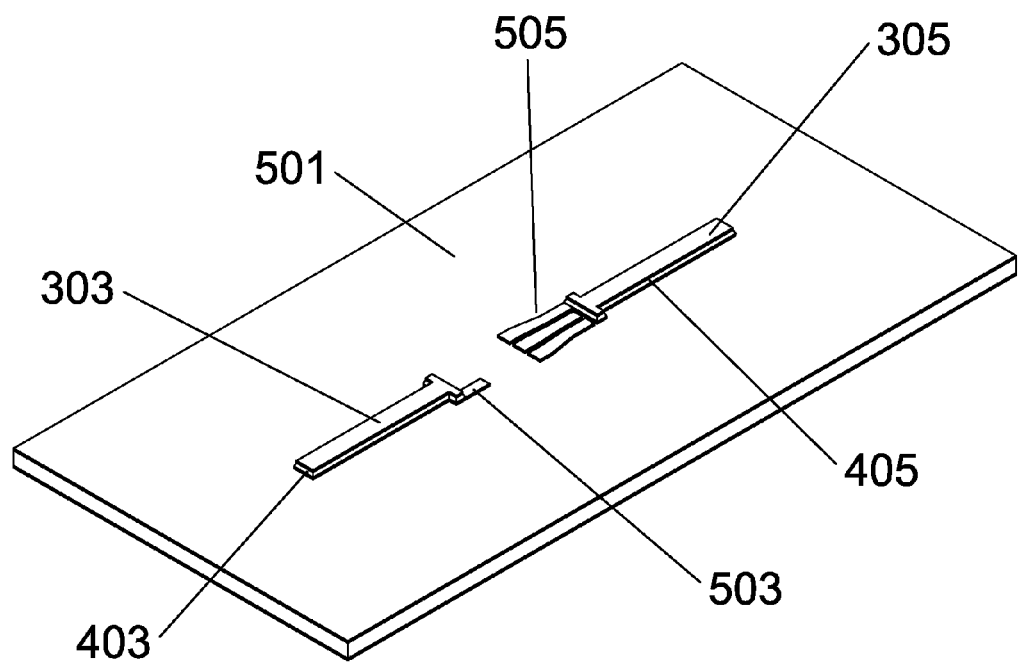
FIG. 5b is a perspective view of the addition of a second electrode pattern.

Once step 004 is completed, the second electrode is patterned from the first conductive layer 201 (depicted in FIG. 2), as shown in step 005 of FIG. 17. FIG. 5a is a cross sectional view of the addition of a second electrode pattern. FIG. 5b is a perspective view of the addition of a second electrode pattern. The selective removal 501 of the first conductive layer 201 (depicted in FIG. 2) forms the second electrode pattern, and as can be seen in FIG. 5b, the first cantilever form half 503 and the second cantilever form half 505 are patterned. The second electrode may be patterned by way of selective material removal, for example by way of selectively etching the first conductive layer 201 with a reactive ion etch such as $SF_6$ or $CF_4$ after masking. As can be seen in FIG. 5b, the first cantilever form half 503 and the second cantilever form half 505 have slightly, different geometries at one end to provide a base for bondpads that will provide a current path from the piezoelectric material to electronic packaging with ohmic contacts, such as pins, by way of a technique such as wire bonding or the like.

Figure 6A:
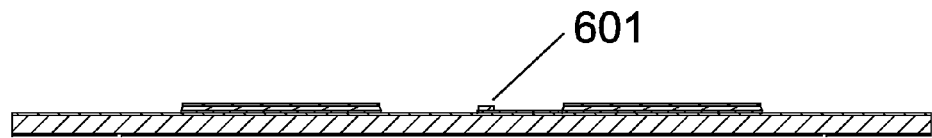
FIG. 6a is a cross sectional view of the addition of bond pads.
Figure 6B:
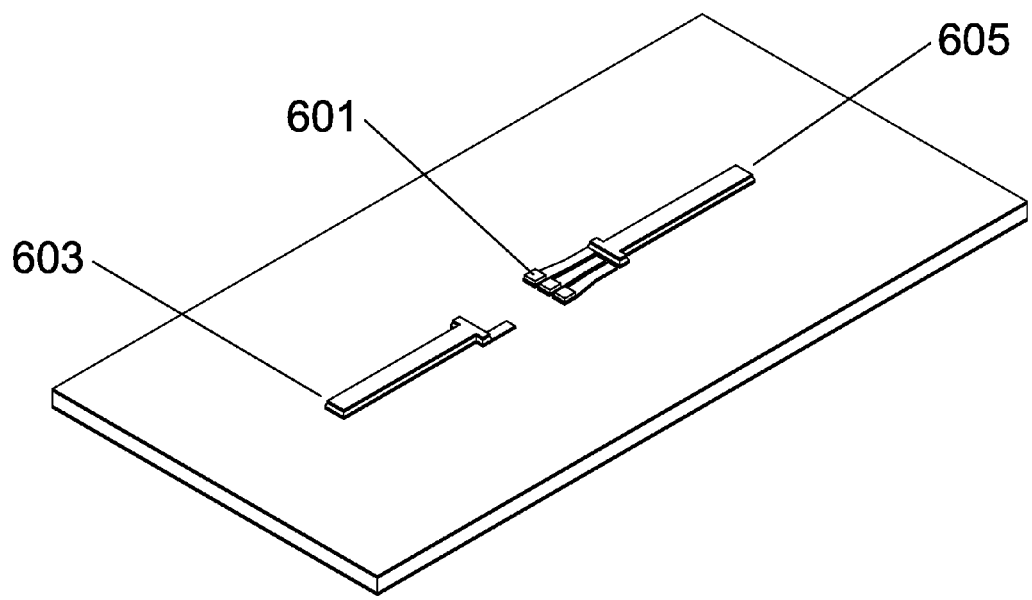
FIG. 6b is a perspective view of the addition of bond pads.

Step 006 of FIG. 17 is the deposition of bondpads. FIG. 6a is a cross sectional view of the addition of bond pads. FIG. 6b is a perspective view of the addition of bond pads. The bond pads may be, in one embodiment of the present invention, aluminum that is evaporated and deposited in a rectangular pattern on the electrode material.

Figure 7A:
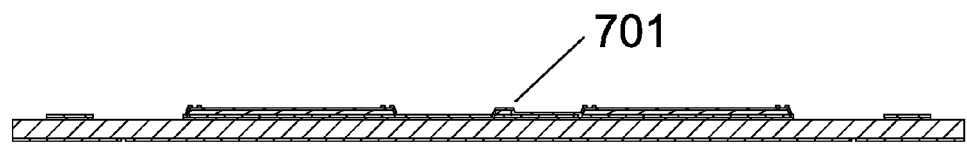
FIG. 7a is a cross sectional view of the addition of a contact layer.
Figure 7B:
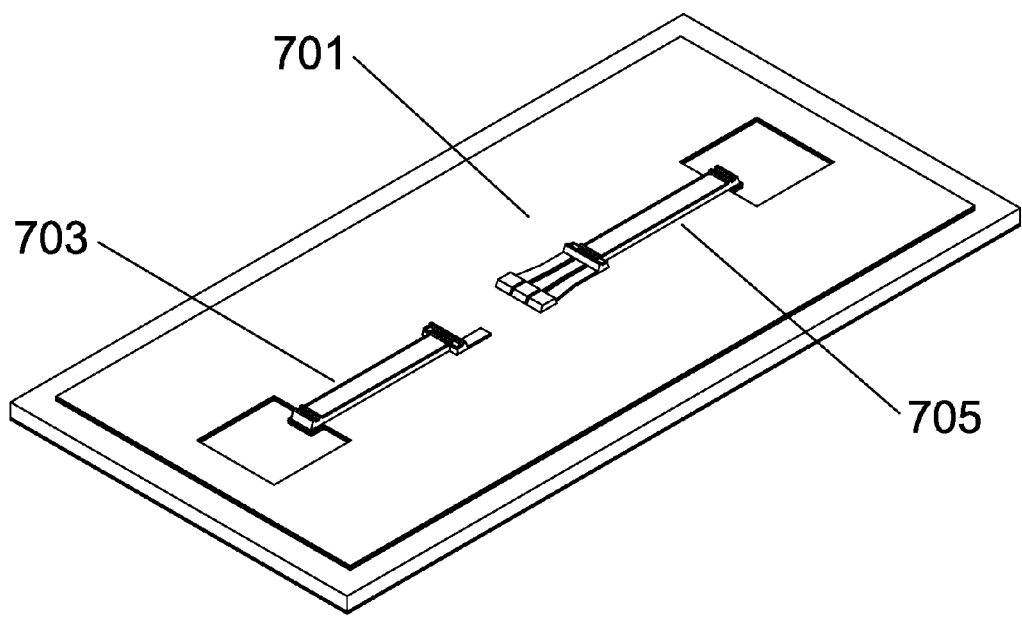
FIG. 7b is a perspective view of the addition of a contact layer.

In step 007 of FIG. 17, an oxide layer is deposited across the entire work piece. An example of such blanket deposition is that of Plasma Enhanced Chemical Vapor Deposition (PECVD) oxide. The contact layer, which is actually the precursor to electrical contacts to be formed, will be etched such that conductive material may be selectively deposited. FIG. 7a is a cross sectional view of the addition of a contact layer. FIG. 7b is a perspective view of the addition of a contact layer. In the ease of Plasma Enhanced Chemical Vapor Deposition (PECVD) oxide being used, a suitable etch would be a reactive ion etch such as $CHF_3/O_2$. The patterned contact layer 701 is shown along with the first cantilever form half 703 and the second cantilever form half 705 in FIG. 7b. Forms for a proof mass can also be seen at the end of each cantilever half.

Figure 8A:
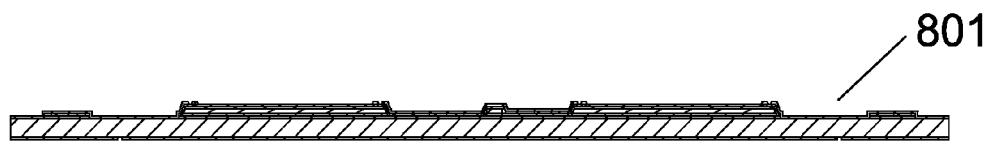
FIG. 8a is a cross sectional view of the addition of a seed layer.
Figure 8B:
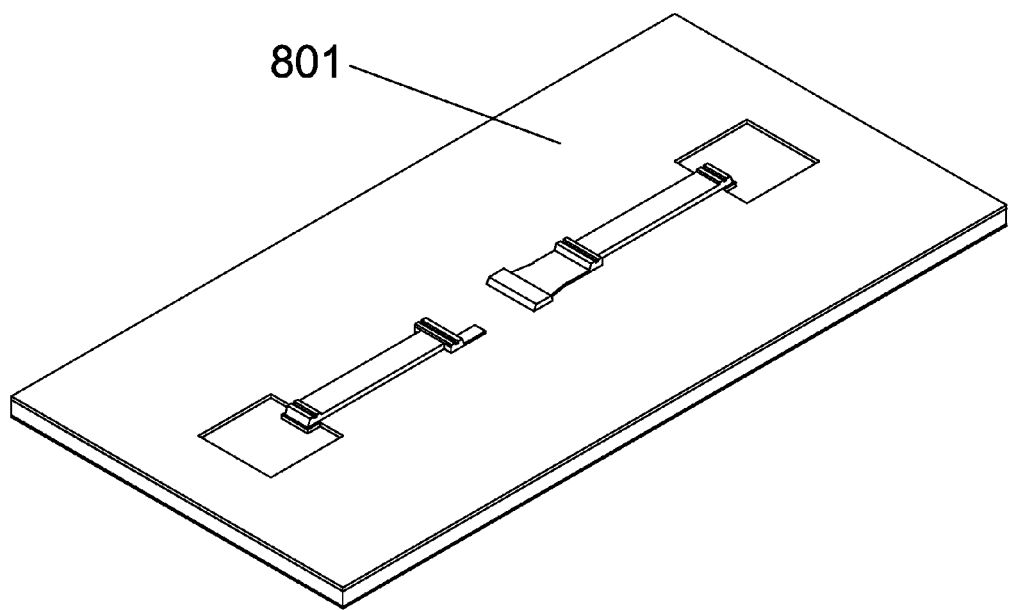
FIG. 8b is a perspective view of the addition of a seed layer.

Once the contact layer is deposited and suitably patterned, in one embodiment of the present invention a seed layer is deposited, as noted in step 008 of FIG. 17. The seed layer is a layer of conductive material that provides the foundation for a later plating step, allowing the plated core to properly bond to its intended surface. In one embodiment of the present invention, the seed layer is gold that is evaporated and blanket deposited. FIG. 8a is across sectional view of the addition of a seed layer. FIG. 8b is a perspective view of the addition of a seed layer. In FIGS. 8a and 8b, the seed layer 801 can be seen.

Figure 9A:
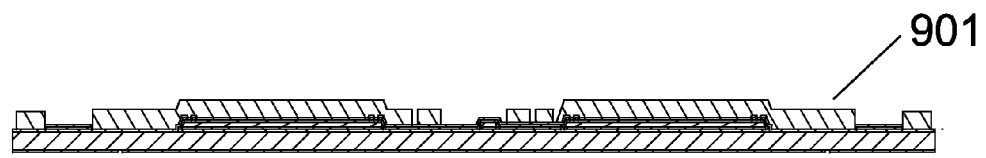
FIG. 9a is a cross sectional view of the addition of a plate layer.
Figure 9B:
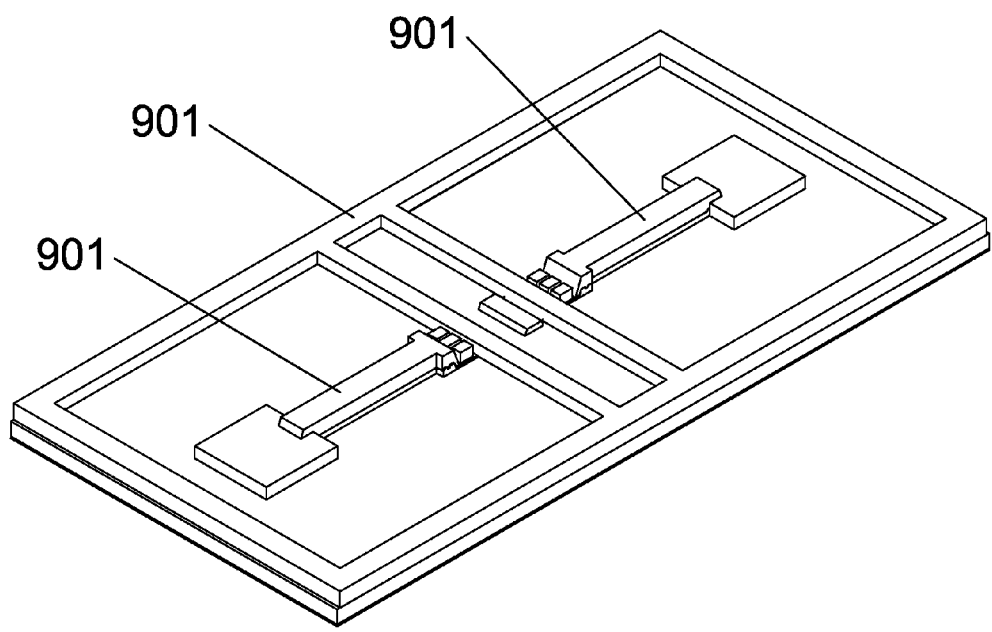
FIG. 9b is a perspective view of the addition of a plate layer.

Once the seed layer is deposited, plating of a material compatible with the seed layer commences. The plated material covers the seed layer and may be, in one embodiment, gold, and whereas the seed layer may be gold as well. Step 009 of FIG. 17 is the Plate step. FIG. 9a is a cross sectional view of the addition of a plate layer. FIG. 9b is a perspective view of the addition of a plate layer. The plate layer is substantially thicker than the seed layer, and may be in the range of 1-10 microns per side. The plate layer comprises what will become the core of the cantilever as well as part of any associated proof mass, should a proof mass be patterned. It is the plate layer of the first cantilever form half that will be bonded to the plate layer of the second cantilever half to form the cantilever.

Plate, as used herein, refers generically to any process that can be used to form each core half. In further embodiments of the present invention, the core can be conductive or nonconductive and can be fabricated using a variety of methods including, but not, limited to, electroplating, physical deposition such as sputter deposition and evaporation, chemical deposition, and the like. Some embodiments of the present invention create a core as a single layer as opposed to a seed and plate process.

Figure 10A:
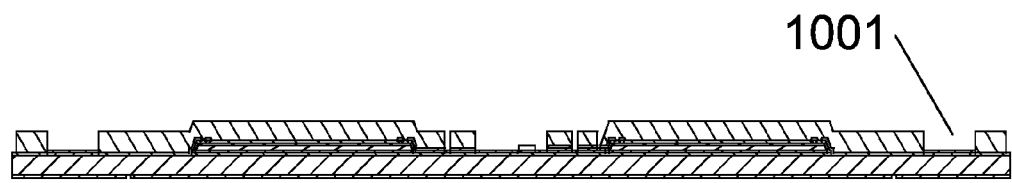
FIG. 10a is a cross sectional view showing the removal of the seed layer.
Figure 10B:
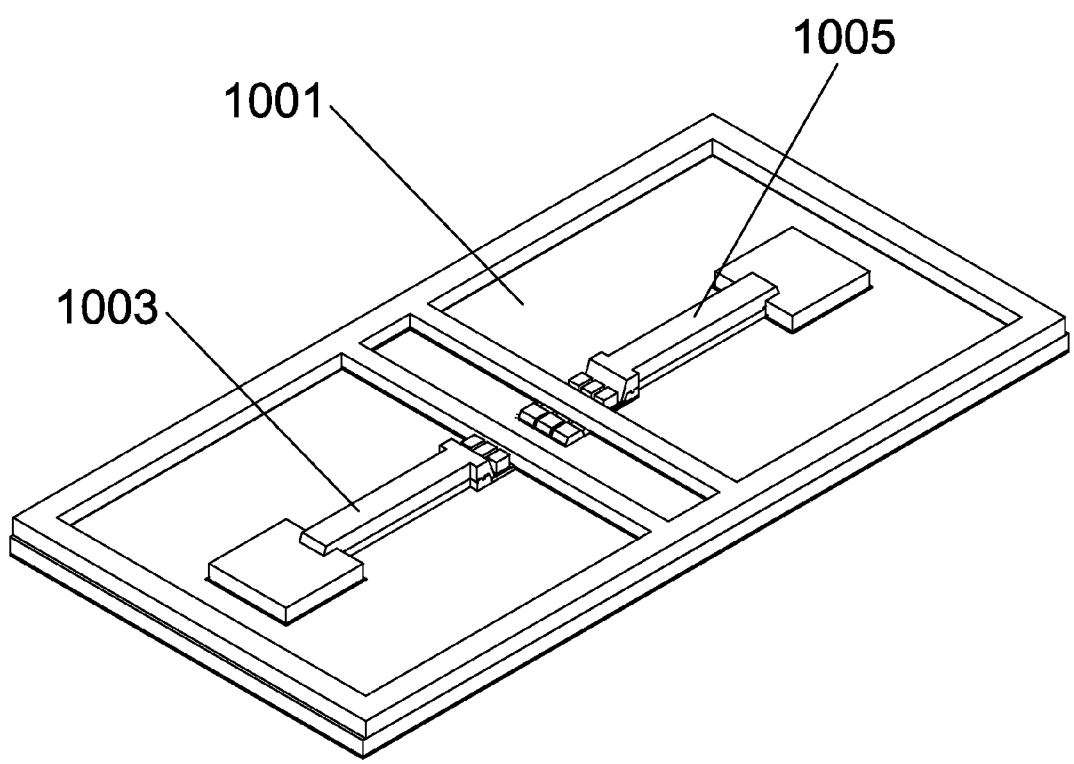
FIG. 10b is a perspective view showing the removal of the seed layer.

At this step in processing, the work piece has seed layer in unwanted areas, such as areas outside the core and proof mass. At step 010 of FIG. 17, the seed layer is removed. Removal techniques include deplating or Iodine Potassium Iodide (IKI) etch, for example. FIG. 10*a* is a cross sectional view showing the removal of the seed layer. FIG. 10*b* is a perspective view showing the removal of the seed layer. The seed layer is shown removed as 1001 in FIGS. 10*a* and 10*b*. In the removal of the unwanted areas of seed layer, a similar thickness of plate may be removed. Since there is an unexposed seed layer beneath the plate that is immune to removal, the thickness of the plate after seed removal is the same as the thickness of the plate itself prior to seed removal.

Figure 11:
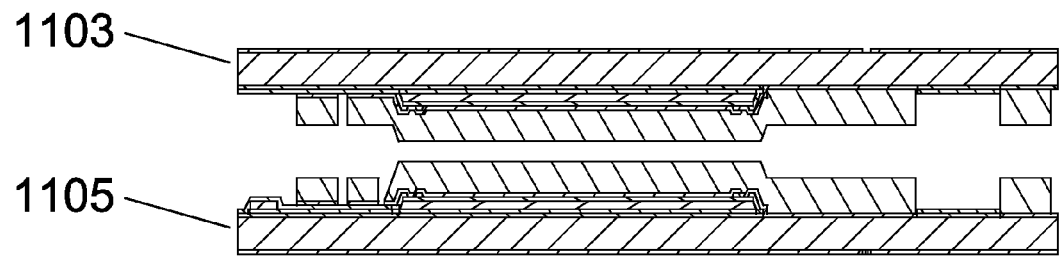
FIG. 11 is a cross sectional view showing wafer alignment.

At this point in processing, the two book halves of the energy harvester of the present invention can be clearly seen in FIG. 10*b*, and have been built up to the point where they are ready to be joined together to make a completed cantilever. In one production method, two wafers containing a plurality of devices are joined together such that the book halves are aligned and where a first cantilever form half on the first wafer aligns with the second cantilever form half on the second wafer. In another production method the book halves are each cut from the same wafer, aligned, and then joined. In another production method a first wafer contains all first cantilever form halves and a second wafer contains all second cantilever form halves. FIG. 11 is a cross sectional view showing wafer alignment where the first cantilever form half 1103 and the second cantilever form half 1105 are aligned and ready for bonding.

Figure 12:
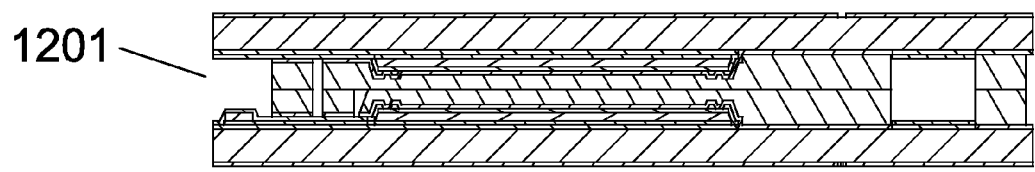
FIG. 12 is a cross sectional view showing wafer bonding.

In step 011/012 of FIG. 17, wafer bonding occurs. FIG. 12 is a cross sectional view showing wafer bonding 1201. Once alignment of the first cantilever half form and the second cantilever half form takes place as previously described, the exposed plate sections of each half are bonded together in a process such as, for example, thermo-compression bonding. The exposed plate sections once bonded become the cantilever core and part of any associated proof mass. After bonding, the second electrode of the first cantilever form half becomes the top electrode of the bimorph structure, the second electrode of the second cantilever half form becomes the bottom electrode of the bimorph structure, and the first electrodes of each cantilever form half, along with the core, become the common electrode of the bimorph structure. In addition, feedthroughs provide a conductive path for electrical signals to travel from the top electrode down to leads and bondpads on the bottom level.

Figure 13:
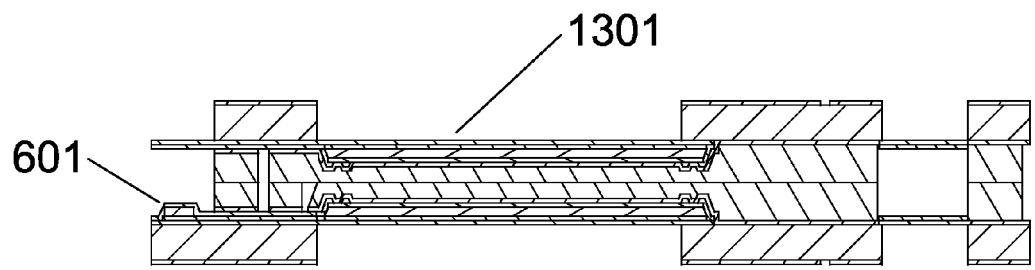
FIG. 13 is a cross sectional view showing the proof mass being patterned.

In step 013 of FIG. 17, the proof mass is patterned. FIG. 13 is a cross sectional view showing the proof mass being patterned. A proof mass etch 1301 is performed to define the proof mass and surrounding support structures.

Figure 14:
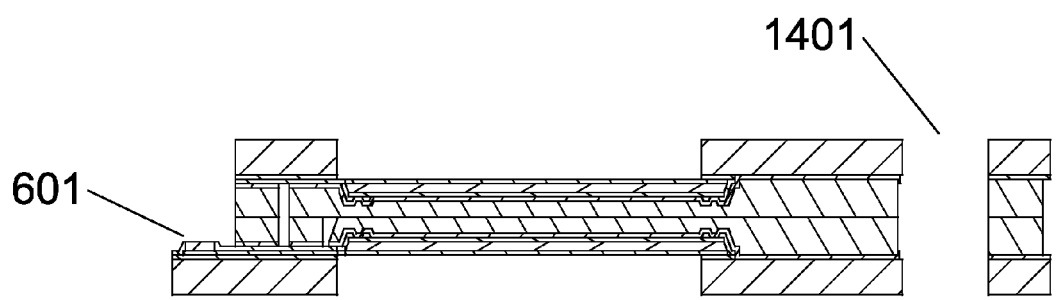
FIG. 14 is a cross sectional view showing singulation and release.

Once the proof mass is patterned, a singulate/release step 014 is performed, as shown in FIG. 17. FIG. 14 is a cross sectional view showing singulation and release. Each device is singulated by cutting (dicing) or breaking the bonded silicon wafers. The sacrificial silicon dioxide supporting the cantilever and proof mass is then removed using a selective etch such as $CHF_3/O_2$ RIE or HF (hydrogen fluoride) vapor, and the cantilever is now free to move. The order of the singulation and sacrificial release may be reversed depending upon whether the sacrificial release is performed on the wafer or on individual chips.

Finally, step 015 of FIG. 17 illustrates a cap/package step where the energy harvester that has been fabricated and is free to move receives optional cap wafers or similar protective packaging. The protective packaging provides a controlled environment for the energy harvester to protect it from damage as well as to affect its performance.

Figure 15:
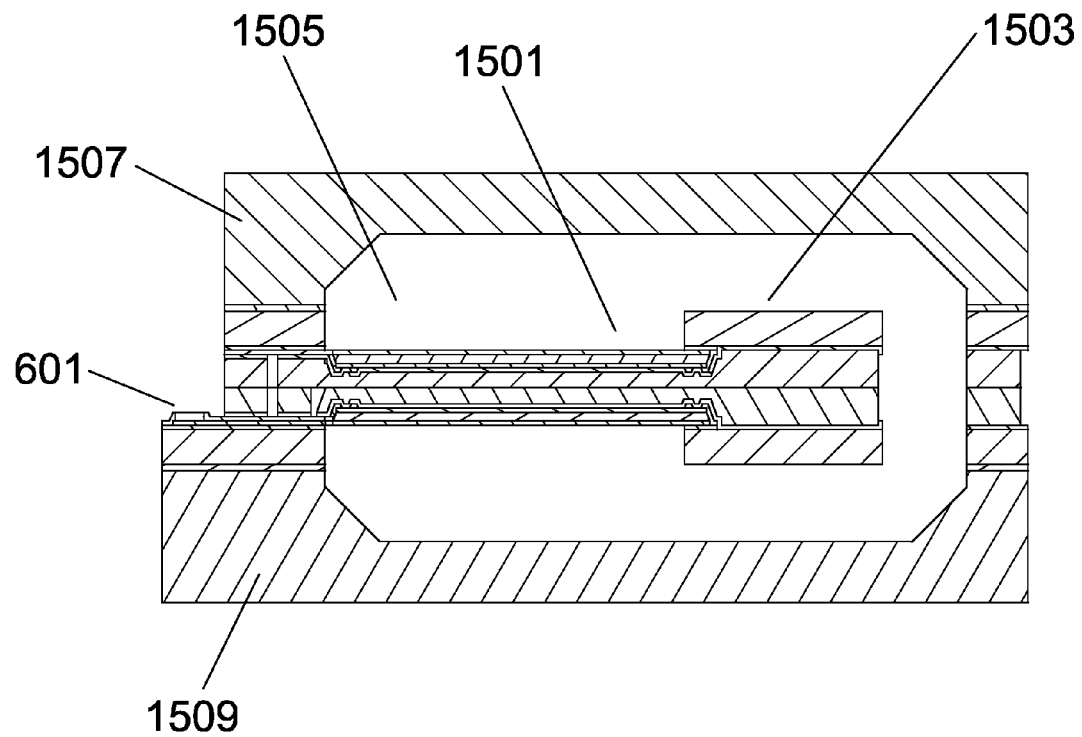
FIG. 15 is a cross sectional view of the device capped.
Figure 16:
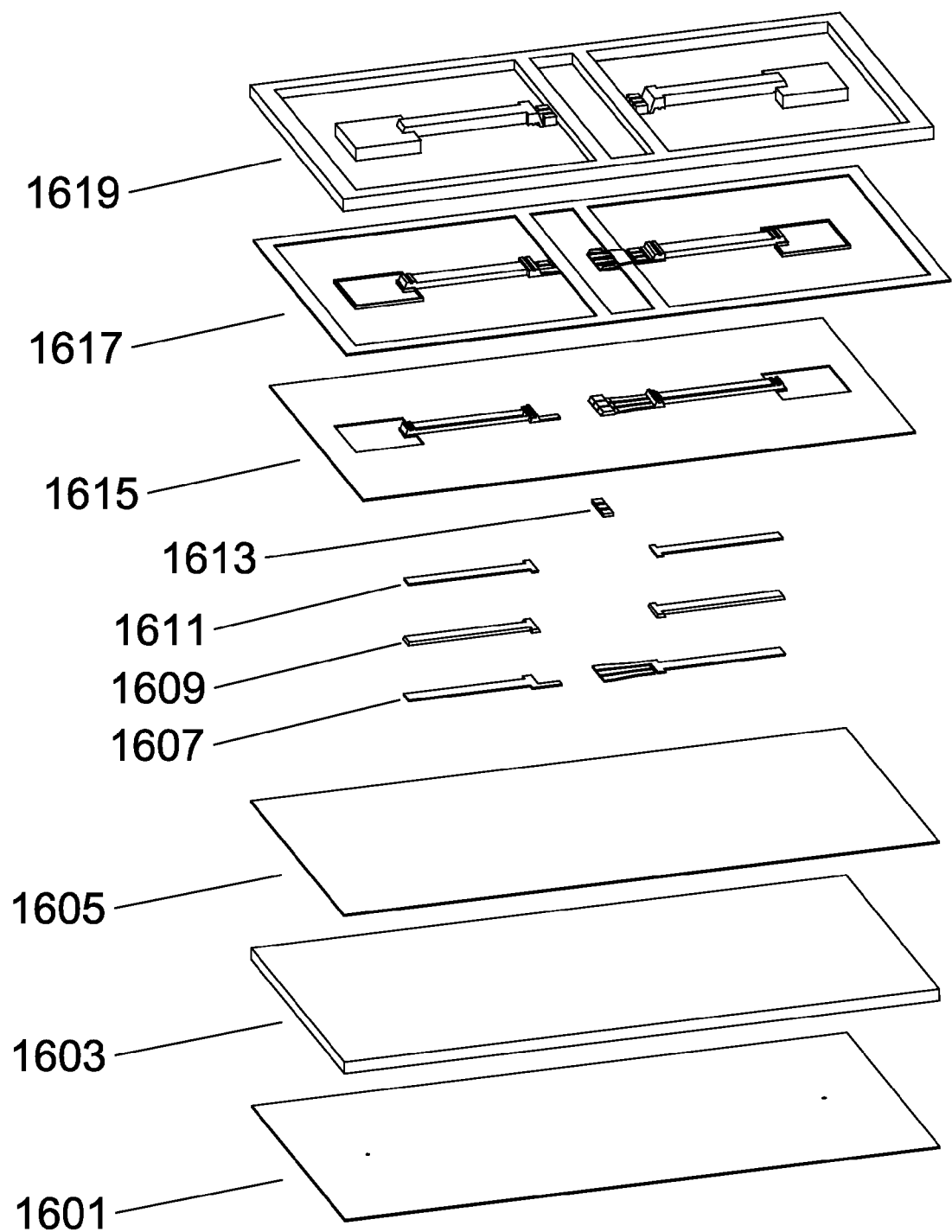
FIG. 16 is an exploded view showing the layers of the device.

FIG. 15 is, a cross sectional view of the device capped. A first cap 1507 and a second cap 1509 are placed on each side of the cantilever 1501. The released proof mass 1503 can be seen with the integral core contained therewith. When capping the energy harvester in step 015, a void 1505 is present. This void may be left as ambient air, or may, in some embodiments of the present invention, be filled with a gas such as an inert gas, or even a fluid. Gas may be provided at a reduced pressure, or even a vacuum. The capping process may also be performed at the chip level or at the wafer level prior to singulation. Variation in gas parameters such as pressure, mix, and the like will affect device performance such as, damping which in turn affects bandwidth, power amplitude, and the like. These variations can be used to control, for example, device performance for an intended application.

FIG. 16 is an exploded view showing the layers of the device that correspond to the previous step by step description of the energy harvesting device. FIG. 16 shows the layers before the two halves of the device are aligned, bonded, and cut 1601 is a first oxide. 1603 is a substrate such as, for example, silicon. 1605 is a second oxide. 1607 is a first conductive layer. 1609 is a piezoelectric material. 1611 is a second conductive layer. 1613 are bond pads. 1615 is a contact layer. 1617 is a seed layer, and 1619 is a plate layer. FIG. 17 depicts a flowchart showing processing steps, and has previously been described. FIG. 18 is a perspective view of the pre-bonded assembly 1801 prior to alignment; bond, and cut. FIG. 19 is a perspective view of the aligned, bonded, and cut energy harvesting device 1901 with the cantilever free to move. The energy harvesting device 1901 has yet to receive end caps, packaging, or related components.

Lastly, FIG. 20 depicts a chip with exemplary cantilevers of the present invention. As previously stated, the geometry and other physical attributes of the cantilever may be modified to suit various intended applications. The chip 2000 contains, for example, a rectangular cantilever 2001, a rectangular cantilever with proof mass 2003, a trapezoidal, cantilever with proof mass 2005, a trapezoidal cantilever 2007, and other geometries made with the process herein described are all within the scope of the present invention and the various embodiments described and envisioned herein.

It is, therefore, apparent that there has been provided, in accordance with the various objects of the present invention, a High-efficiency MEMS Micro-Vibrational Energy Harvester and Process for Manufacturing Same. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, drawings, and the claims appended herein.

What is claimed is:
1. A vibrational energy harvesting device comprising:
   a cantilever having a first end, a second end and a core having a first planar surface and a second planar surface, the core being fabricated as two plate layers and bonded together;
   a first piezoelectric stack having a piezoelectric material placed between a first conductive layer and a second conductive layer and attached to the first planar surface of said core;
   a second piezoelectric stack having a piezoelectric material placed between a first conductive layer and a second conductive layer and attached to the second planar surface of said core; and a casing wherein the first end of the cantilever is joined to the casing and the second end is free to move.

2. The vibrational energy harvesting device as recited in claim 1, further comprising a proof mass mechanically couple to the second end of the cantilever.

3. The vibrational energy harvesting device as recited in claim 1, further comprising an electrical contact operatively coupled to said first piezoelectric stack.

4. The vibrational energy harvesting device as recited in claim 1, further comprising an electrical contact operatively coupled to said second piezoelectric stack.

5. The vibrational energy harvesting device as recited in claim 1, wherein said core is gold.

6. The vibrational energy harvesting device as recited in claim 1, wherein said core is copper.

7. The vibrational energy harvesting device as recited in claim 1. wherein said core is nickel.

8. The vibrational energy harvesting device as recited in claim 1, wherein said piezoelectric material is aluminum nitride.

9. The vibrational energy harvesting device as recited in claim 1, wherein said casing is silicon.

10. The vibrational energy harvesting device as recited in claim 1, wherein said cantilever is rectangular.

11. The vibrational energy harvesting device recited in claim 1, wherein said cantilever is trapezoidal.

12. The vibrational energy harvesting device as recited in claim 1, further comprising a first cap and a second cap.

13. The vibrational energy harvesting device as recited in claim 12, further comprising an inert gas contained within the first cap and the second cap.

14. The vibrational energy harvesting device as recited in claim 12, further comprising a gas at a pressure less than one atmosphere contained within the first cap and the second cap.

15. A method for fabricating the vibrational energy harvesting device of claim 1 comprising the steps of:
   creating a first wafer set and a second wafer set by
      forming an oxide layer on a substrate;
      depositing a first and second piezoelectric stack on the substrate;
      patterning a first electrode;
      patterning a piezoelectric material;
      patterning a second electrode;
      depositing bond pads;
      depositing a contact layer;
      etching contacts in said contact layer;
      patterning a core layer;
   aligning, the plate layer of the first wafer set with the plate layer of the second wafer set;
   bonding said first wafer set to said second wafer set to form a core;
   patterning a resulting vibrational energy harvesting device; and
   singulating and releasing the resulting vibrational energy harvesting device.

16. The method as recited in claim 15, wherein said core layer is formed by the steps of depositing a seed layer and plating said seed layer.

17. The method as recited in claim 15, further comprising the step of capping the resulting vibrational energy harvesting device.

18. The method as recited in claim 15, further comprising the step of wire bonding the resulting vibrational energy harvesting device.

19. The method as recited in claim 15, further comprising the step of packaging the resulting vibrational energy harvesting device.

20. An energy harvesting circuit comprising:
   a vibrational energy harvesting device in accordance with claim 1;
   a power rectification circuit for converting oscillatory current electric power to direct current electric power; and
   an energy storage device.

21. The energy harvesting circuit as recited in claim 20 wherein the energy storage device is a battery.

22. The energy harvesting circuit as recited in claim 20 wherein the energy storage device is a capacitor.

23. A chipset having a substrate and a vibrational energy harvesting device comprising a cantilever having a first end, a second end and a core having a first planar surface and a second planar surface, the core being fabricated as two plate layers and bonded together;
   a first piezoelectric stack having a piezoelectric material placed between a first conductive layer and a second conductive layer and attached to the first planar surface of said core; a second piezoelectric stack having a piezoelectric material placed between a first conductive layer and a second conductive layer and attached to the second planar surface of said core; and a casing wherein the first end of the cantilever is joined to the casing and the second end is free to move.

24. The chipset as recited in claim 23 wherein the substrate is silicon.

25. The chipset as recited in claim 23, further comprising a proof mass mechanically coupled to the second end of the cantilever.

* * * * *